(12) United States Patent
Ho (10) Patent No.: US 11,626,441 B2
(45) Date of Patent: Apr. 11, 2023

(54) OPTICAL MODULE

(71) Applicant: Advanced Semiconductor Engineering, Inc., Kaohsiung (TW)

(72) Inventor: Hsin-Ying Ho, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 423 days.

(21) Appl. No.: 16/745,139

(22) Filed: Jan. 16, 2020

(65) Prior Publication Data

US 2021/0225917 A1 Jul. 22, 2021

(51) Int. Cl.
*H01L 27/146* (2006.01)
*G02B 3/00* (2006.01)

(52) U.S. Cl.
CPC ...... *H01L 27/14627* (2013.01); *G02B 3/0056* (2013.01); *H01L 27/14623* (2013.01)

(58) Field of Classification Search
CPC .............. G02B 3/0037; G02B 3/0056; H01L 27/14627; H01L 27/14623; H01L 27/1462; H01L 27/14603; H01L 27/14601; H01L 27/146
See application file for complete search history.

(56) References Cited

U.S. PATENT DOCUMENTS

| | | | | |
|---|---|---|---|---|
| 9,793,308 B2* | 10/2017 | Gidon | ............... | H01L 27/14621 |
| 10,115,753 B2* | 10/2018 | Baek | ................ | H01L 27/14638 |
| 10,627,549 B2* | 4/2020 | Yamamoto | ............ | G02B 27/32 |
| 10,892,289 B2* | 1/2021 | Park | ....................... | G06F 21/32 |
| 2020/0259979 A1* | 8/2020 | Kang | ................ | H04N 5/23229 |
| 2021/0225917 A1* | 7/2021 | Ho | ................... | H01L 27/14623 |
| 2021/0333441 A1* | 10/2021 | Schwartz | ............... | G02B 27/30 |

FOREIGN PATENT DOCUMENTS

CN 110473887 A 11/2019

OTHER PUBLICATIONS

Office Action from corresponding Taiwanese Patent Application No. 109146607, dated Jan. 30, 2023, 10 pages.
Search Report with English translation for corresponding Taiwanese Patent Application No. 109146607, dated Jan. 30, 2023, 2 pages.

* cited by examiner

*Primary Examiner* — John R Lee
(74) *Attorney, Agent, or Firm* — Foley & Lardner LLP (57) ABSTRACT

An optical module includes an image sensor and micro lens array. The image sensor has at least one group of pixels. The micro lens array is disposed on the image sensor. The at least one group of pixels is shifted from the micro lens array in a first direction from a top view perspective.

9 Claims, 15 Drawing Sheets

OPTICAL MODULE

TECHNICAL FIELD

The present disclosure relates to an optical module, and to an optical module including an image sensor and micro lens array.

DESCRIPTION OF THE RELATED ART

An optical module can include an optical structure arranged on a complementary metal-oxide-semiconductor (CMOS) image sensor (CIS) to receive or collect optical information (e.g. fingerprint image). However, the received optical information may include some unwanted signals (or noises, interferences, etc.) which may adversely affect detection of the object.

SUMMARY

In accordance with some embodiments of the present disclosure, an optical module includes an image sensor and micro lens array. The image sensor has at least one group of pixels. The micro lens array is disposed on the image sensor. The at least one group of pixels is shifted from the micro lens array in a first direction from a top view perspective.

In accordance with some embodiments of the present disclosure, an optical module includes an image sensor and a micro lens array. The image sensor has at least one group of pixels. The micro lens array is disposed on the image sensor. A projection of one of the micro lens array falls on at least two of the at least one group of pixels.

In accordance with some embodiments of the present disclosure, an optical module includes an image sensor and a micro lens array and an opaque layer. The image sensor has at least one group of pixels. The micro lens array is disposed on the image sensor. The opaque layer is disposed on the at least one group of pixels (80) and comprising a plurality of holes. A projection area of one lens of the micro lens array is apart from at least one of the plurality of holes.

BRIEF DESCRIPTION OF THE DRAWINGS

Aspects of the present disclosure are best understood from the following detailed description when read with the accompanying drawings. It is noted that various features may not be drawn to scale, and the dimensions of the various features may be arbitrarily increased or reduced for clarity of discussion.

Common reference numerals are used throughout the drawings and the detailed description to indicate the same or similar components. The present disclosure will be readily understood from the following detailed description taken in conjunction with the accompanying drawings.

DETAILED DESCRIPTION

Various embodiments of the present disclosure are discussed in detail below. It should be appreciated, however, that the embodiments set forth many applicable concepts that can be embodied in a wide variety of specific contexts. It is to be understood that the following disclosure provides for many different embodiments or examples of implementing different features of various embodiments. Specific examples of components and arrangements are described below for purposes of discussion. These are, of course, merely examples and not intended to be limiting.

Embodiments, or examples, illustrated in the drawings are disclosed below using specific language. It will nevertheless be understood that the embodiments and examples are not intended to be limiting. Any alterations and modifications of the disclosed embodiments, and any further applications of the principles disclosed in this document, as would normally occur to one of ordinary skill in the pertinent art, fall within the scope of this disclosure.

In addition, the present disclosure may repeat reference numerals and/or letters in the various examples. This repetition is for the purpose of simplicity and clarity and does not in itself dictate a relationship between the various embodiments and/or configurations discussed.

Figure 1:
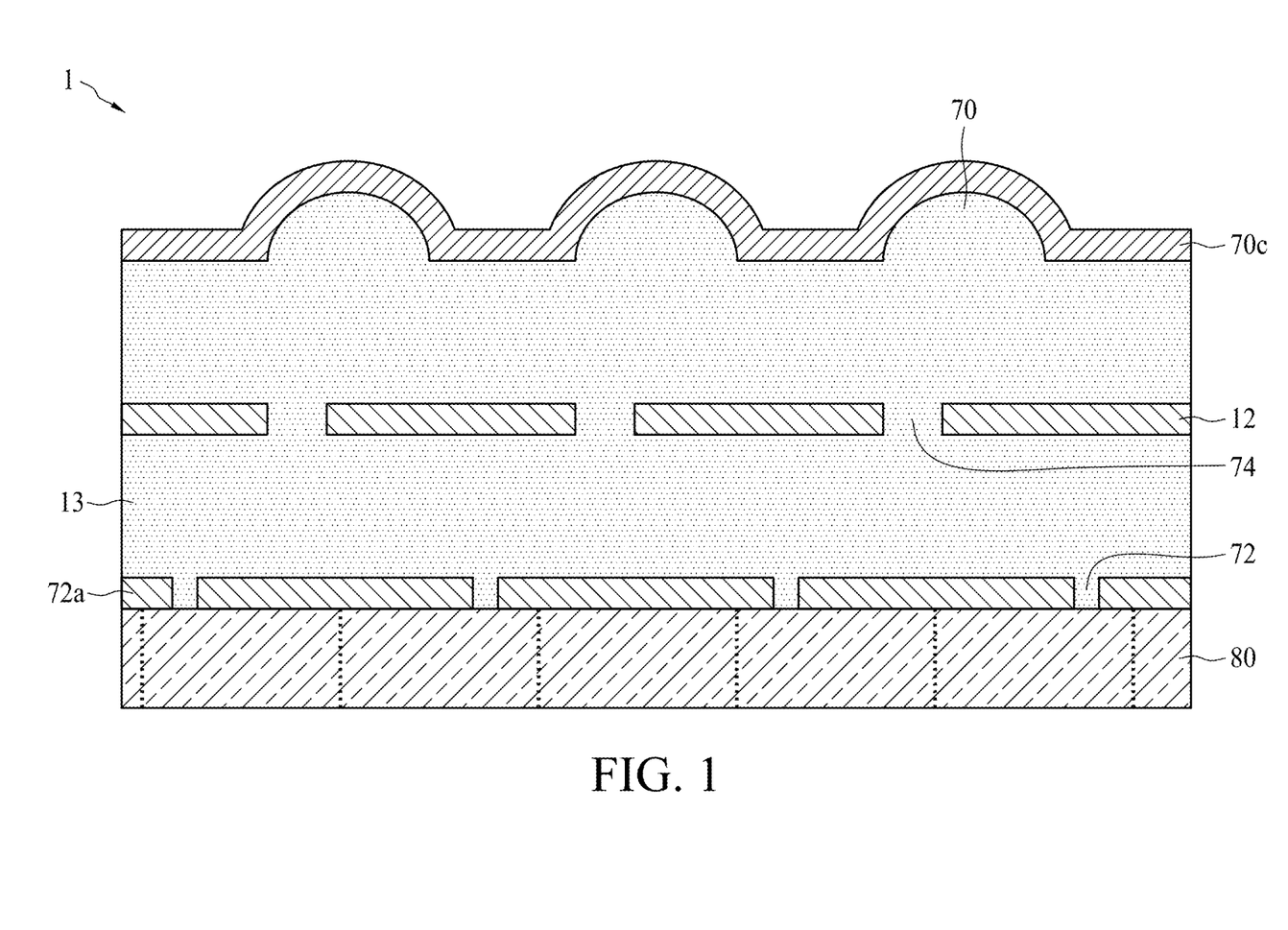
FIG. 1 illustrates a cross section of an optical module in accordance with some embodiments of the present disclosure.

FIG. 1 illustrates a cross section of an optical module 1 in accordance with some embodiments of the present disclosure. The optical module 1 includes at least one group of pixels 80, an opaque layer 72a, a transparent material 13, an opaque layer 12, a micro lens array 70 and a coating layer 70c, 70c also can be applied on 72a instead of top side.

The opaque layer 72a is disposed on the at least one group of pixels 80. The opaque layer 72a includes a plurality of holes 72. The opaque layer 12 is disposed between the at least one group of pixels 80 and the micro lens array 70. In some embodiments, the transparent material 13 may be a transparent photo resist material 13. The opaque layer 12 includes a plurality of apertures 74. The coating layer 70c is disposed on the micro lens array 70.

Figure 2:
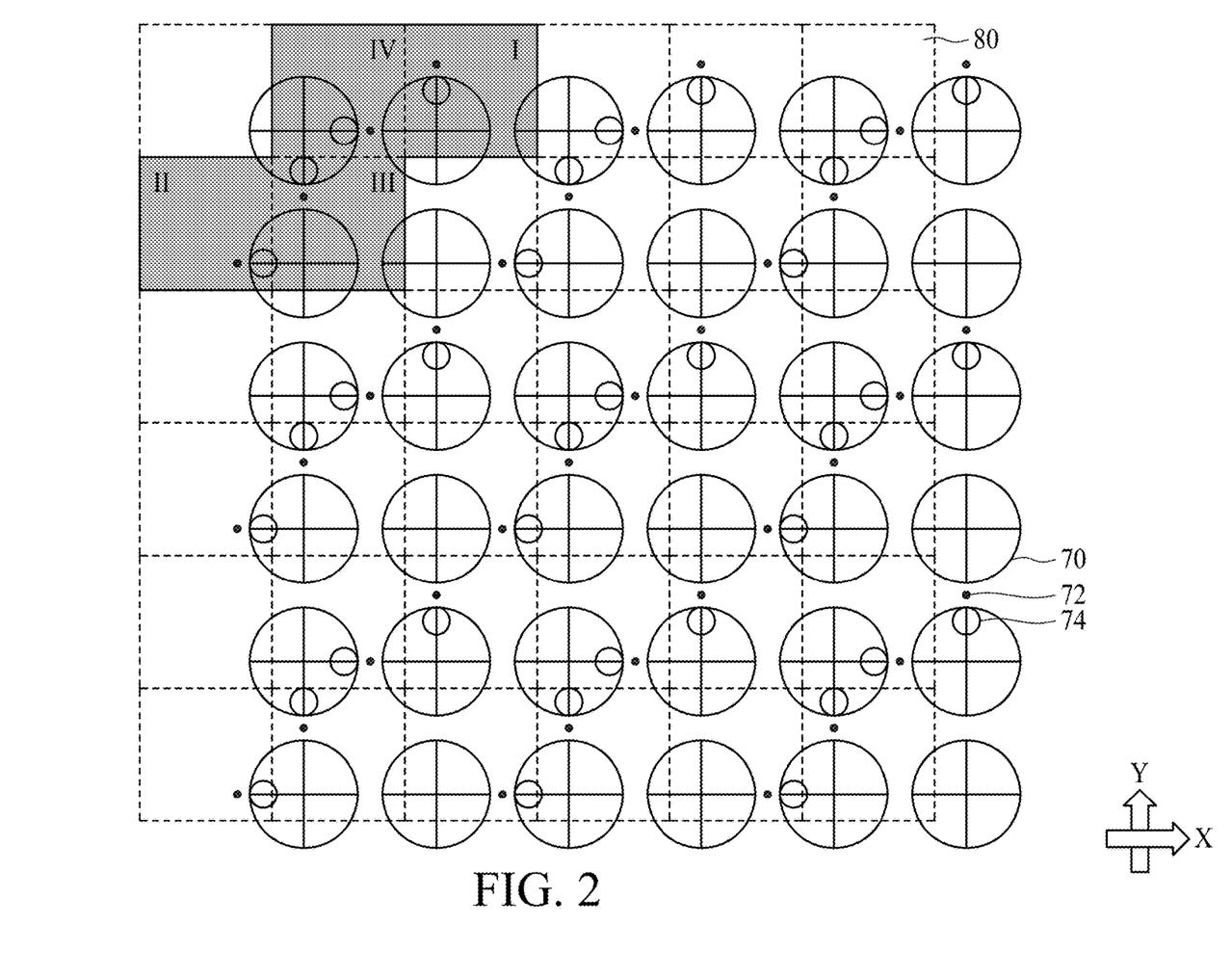
FIG. 2 illustrates a top view of the optical module in accordance with some embodiments of the present disclosure.

FIG. 2 illustrates a top view of the optical module 1 in accordance with some embodiments of the present disclosure. In some embodiments, the at least one group of pixels 80 is shifted from the micro lens array 70 in a first direction from a top view perspective. In some embodiments, the first direction may be the X direction. In some embodiments, the at least one group of pixels 80 is shifted from the micro lens array 70 in a second direction from a top view perspective.

In some embodiments, the second direction may be the Y direction. The first direction is in perpendicular to the second direction.

At least one lens of the micro lens array 70 is shifted from a geometrical central axis of one corresponding pixel of the pixels 80 (such as the region III). In some embodiments, the area of the pixel of the region III is partially covered by a projection of four lenses.

In some embodiments, the at least one aperture 74 is adjacent to the peripheral of one lens of the micro lens array 70 and is shifted from a geometrical central axis of the lens of the micro lens array 70. In some embodiments, a projection of one lens of the micro lens array 70 falls on the aperture 74 in the pixel of the region I. In some embodiments, a projection area of one lens (such as the lens in the region I) of the micro lens array 70 is apart from at least one hole 72 (such as the hole in the region I).

In some embodiments, at least one of the plurality of holes 72 is adjacent to the peripheral of one lens of the micro lens array 70 and is shifted from a geometrical central axis of the lens of the micro lens array 70. In some embodiments, a projection of one lens of the micro lens array 70 falls one of the plurality of holes 72 in the pixel of the region I. In some embodiments, at least one of the plurality of holes 72 is shifted from one aperture 74 of the opaque layer 12.

In some embodiments, a projection of one of the micro lens array 70 falls on at least two of the at least one group of pixels 80. In some embodiments, a projection of one of the micro lens array 70 falls on at least three of the at least one group of pixels 80. In some embodiments, a projection of one of the micro lens array 70 falls on at least four of the at least one group of pixels 80.

In some embodiments, an incident light passes through one lens of the micro lens array 70 (such as the lens falls on the regions I and IV), an aperture 74 (such as the aperture falls on the region I) adjacent to the peripheral of the lens of the micro lens array 70 and one of the plurality of holes 72 (such as the a hole falls on the region I) adjacent to the peripheral of the lens of the micro lens array 70. In some embodiments, at least one of the plurality of holes 72 is disposed between two adjacent lens of the micro lens array 70.

Figure 3:
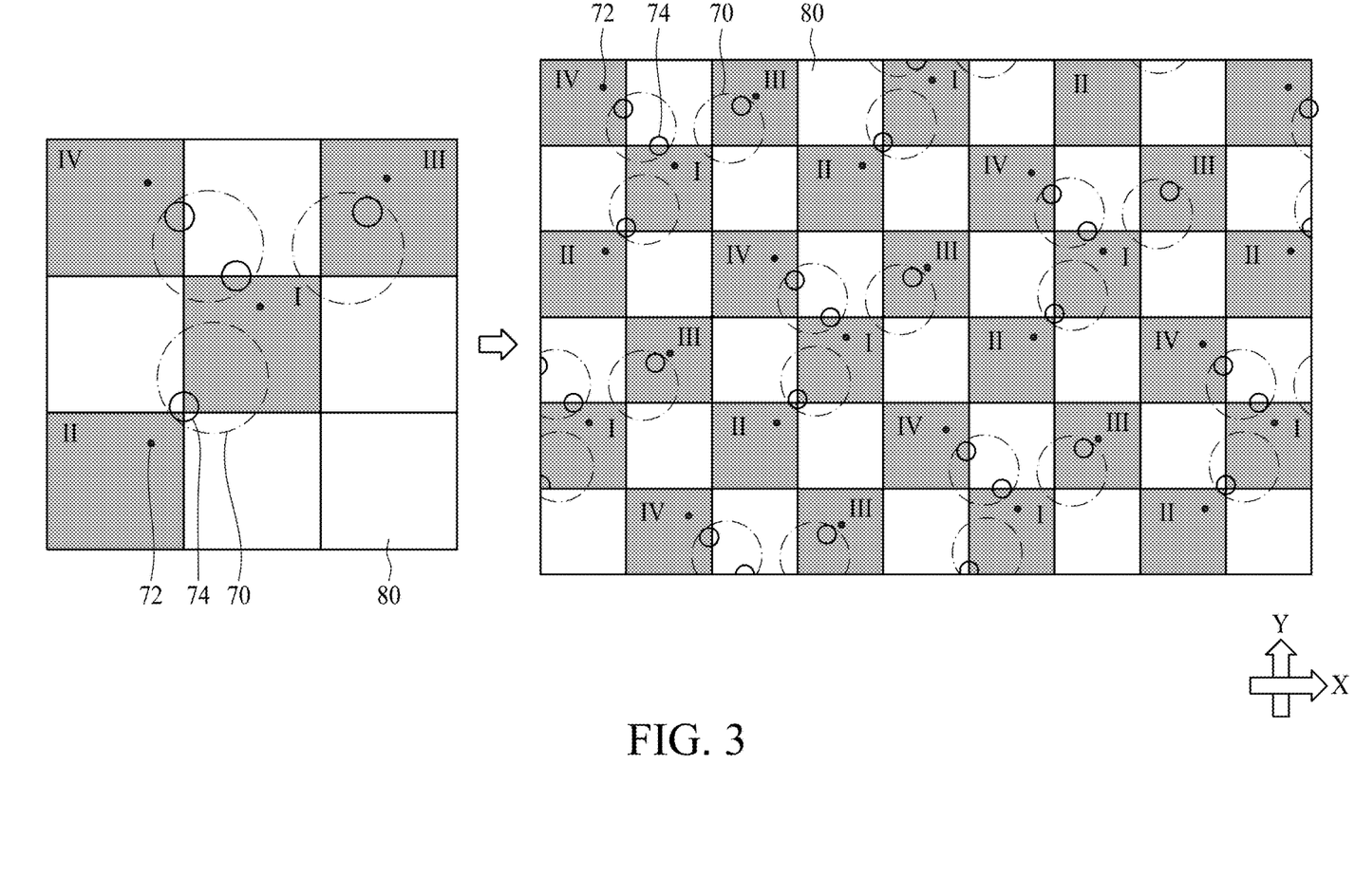
FIG. 3 illustrates a top view of the optical module in accordance with some embodiments of the present disclosure.

FIG. 3 illustrates a top view of the optical module 1 in accordance with some embodiments of the present disclosure. In some embodiments, a projection of the aperture 74 of the opaque layer 12 falls on at least two of the at least one group of pixels 80. One of the plurality of holes 72 is disposed between three of the micro lens array 70. In some embodiments, a projection of one lens of the micro lens array 70 falls on one aperture 74. In some embodiments, a projection of one lens of the micro lens array 70 falls on two apertures 74. (such as this embodiment, this arrangement can detect the different four directions well, but the utilization of pixels is low)

Figure 4:
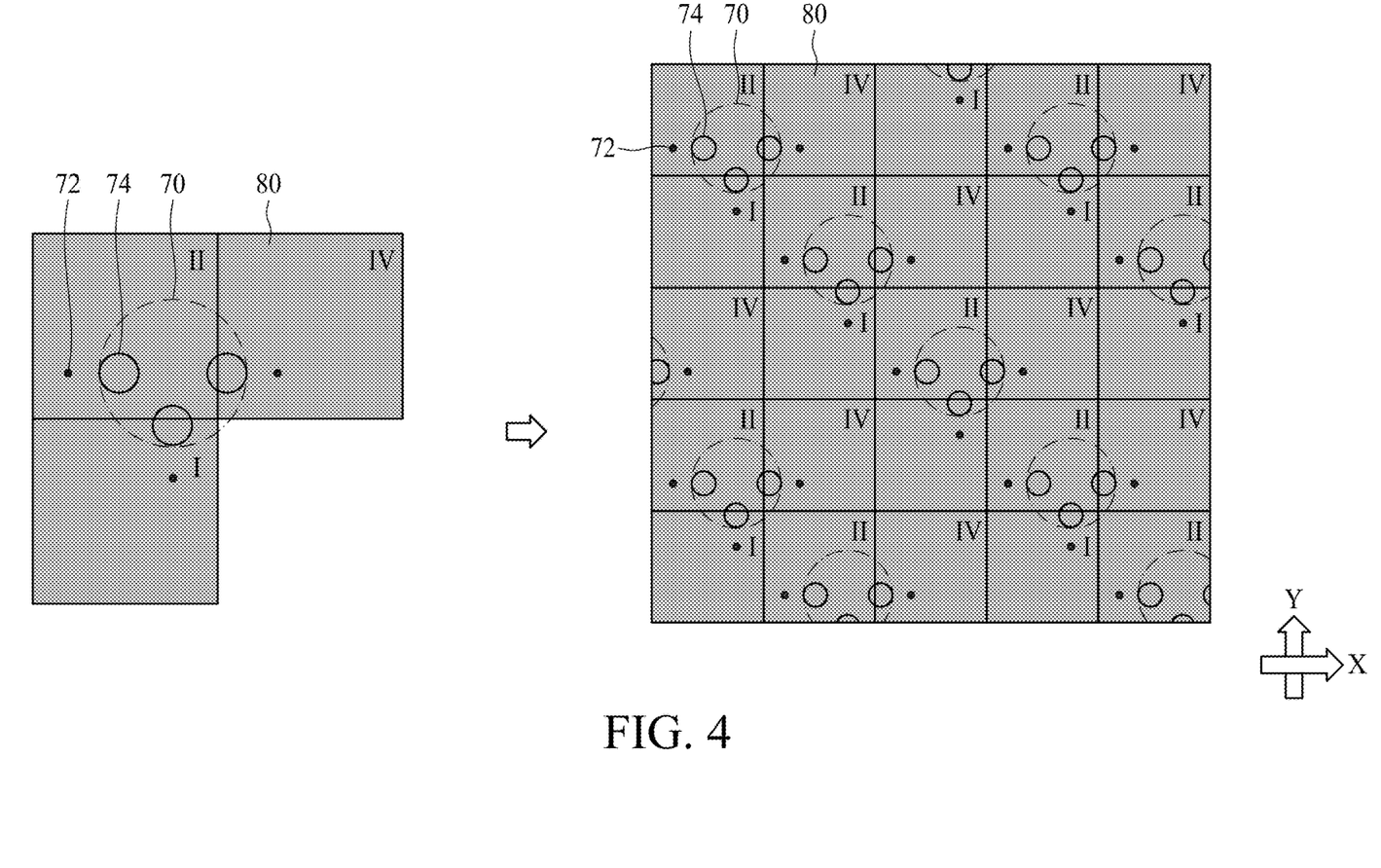
FIG. 4 illustrates a top view of the optical module in accordance with some embodiments of the present disclosure.

FIG. 4 illustrates a top view of the optical module 1 in accordance with some embodiments of the present disclosure. A projection of one of the micro lens array 70 falls on at least four of the at least one group of pixels 80. In some embodiments, a projection of one lens of the micro lens array 70 falls on three apertures 74 and three different incident lights respectively pass through three different apertures 74. In some embodiments, three different incident lights respectively three different holes 72. (such as this embodiment, this arrangement can detect three different directions only to keep high utilization of pixels)

Figure 5A:
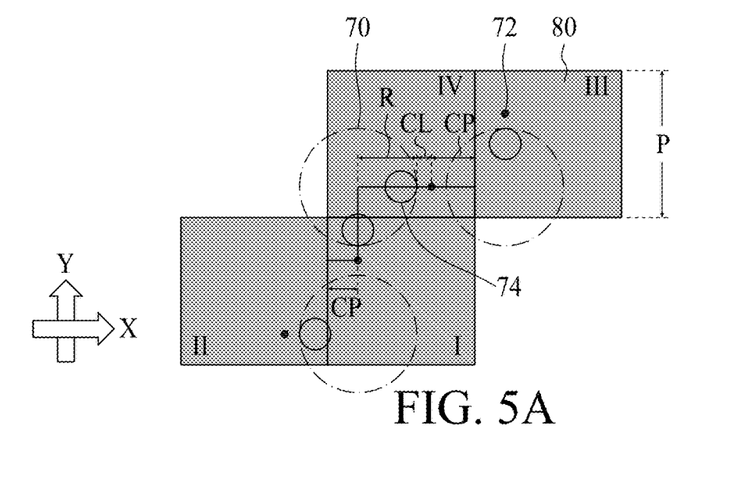
FIG. 5A to FIG. 5C illustrate a top view of the optical module in accordance with some embodiments of the present disclosure.
Figure 5B:
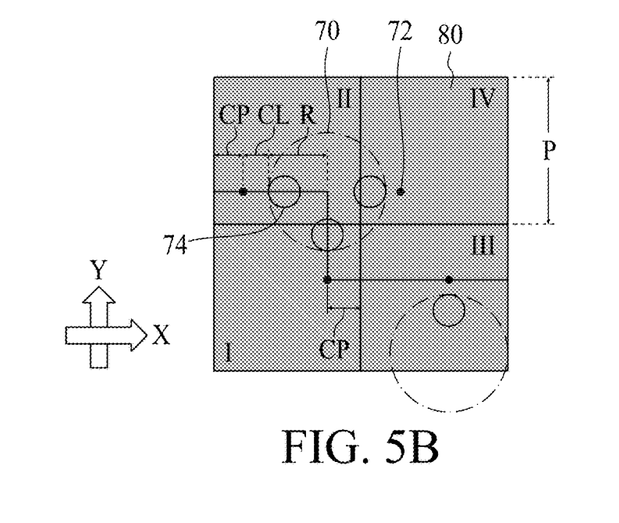
Figure 5C:
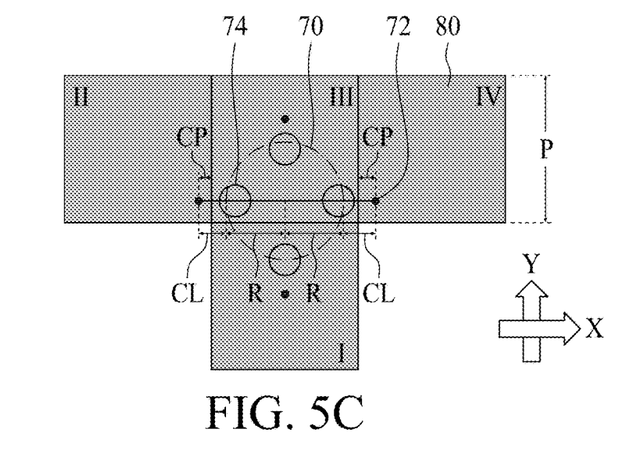

FIG. 5A to FIG. 5C illustrate a top view of the optical module 1 in accordance with some embodiments of the present disclosure. In some embodiments, a projection of one lens of the micro lens array 70 falls on two pixels (such as regions I and III). In some embodiments, a projection of one lens of the micro lens array 70 falls on four pixels (such as regions I, II, III and IV). In some embodiments, a projection of one lens of the micro lens array 70 falls on one aperture 74. In some embodiments, a projection of one lens of the micro lens array 70 falls on two apertures 74. In some embodiments, a projection of one lens of the micro lens array 70 falls on three apertures 74. In some embodiments, a projection of one lens of the micro lens array 70 falls on a portion of each of four apertures 74. In some embodiments, a projection of one lens of the micro lens array 70 falls on four apertures 74. Referring to FIG. 5A, the length of the pixel 80, the lens of the micro lens array 70 and the related position of the holes 72 are selected in accordance with the following equations.

$$CP+R+CL+CP=P$$

$$R \leq P/2$$

The parameter CP is the minimum length from the hole 72 to the edge of the pixel 80. The parameter R is the radius of one lens of the micro lens array 70. The parameter CL is the length from the hole 72 to the edge of the lens of the micro lens array 70. The parameter P is the length of one edge of the pixel 80. The parameter R is less than or equal to a half of the parameter P. In some embodiment, a projection of one lens of the micro lens array 70 is contact with the peripheral of the apertures 74. The distance between the geometrical central axis of one lens of the micro lens array 70 and the geometrical central axis of the apertures 74 is larger than the radius of the apertures 74. The peripheral of the apertures 74 is apart from a geometrical central axis of one lens of the micro lens array 70. The geometrical central axis of the apertures 74 is apart from geometrical central axis of one lens of the micro lens array 70.

Referring to FIG. 5B, the length of the pixel 80, the lens of the micro lens array 70 and the related position of the holes 72 are selected in accordance with the following equations.

$$CP+CL+R+CP=P$$

$$R \leq \sqrt{2} \times P/2$$

The parameter R is less than or equal to a half of the parameter P multiplied by $\sqrt{2}$.

Referring to FIG. 5C, the length of the pixel 80, the lens of the micro lens array 70 and the related position of the holes 72 are selected in accordance with the following equations. (the second equation below refers to the direction from the pixel regions I to III). In some embodiment, a projection of one lens of the micro lens array 70 falls in the area of the aperture 74.

$$2R+2CL-P=2CP$$

$$P \leq 2R+2CL \leq 2P$$

Figure 6:
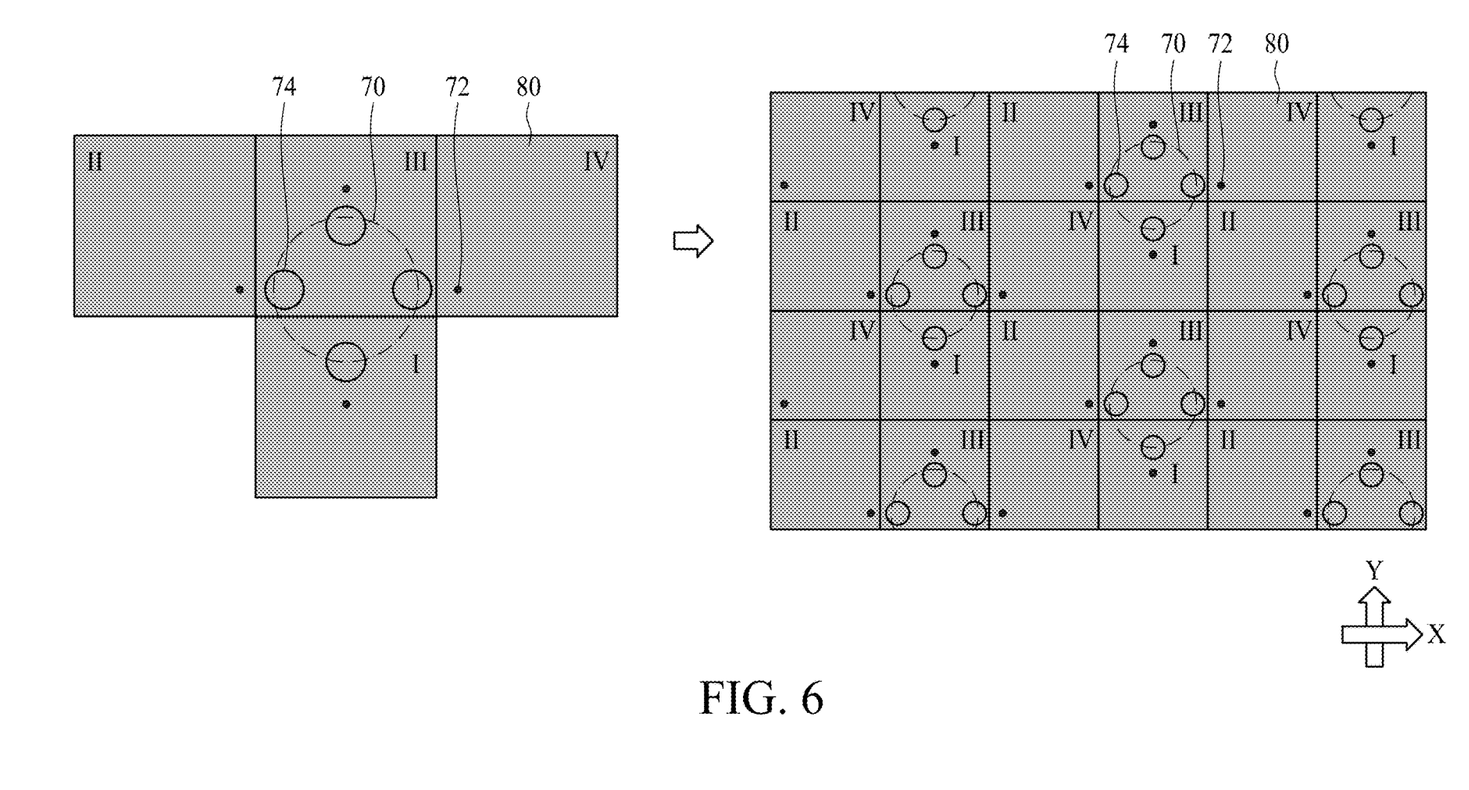
FIG. 6 illustrates a top view of the optical module in accordance with some embodiments of the present disclosure.

FIG. 6 illustrates a top view of the optical module 1 in accordance with some embodiments of the present disclosure. A projection of one lens of the micro lens array 70 falls on a portion of the four apertures 74. In some embodiments, a projection of one lens of the micro lens array 70 falls on a portion of each of four apertures 74.

Figure 7:
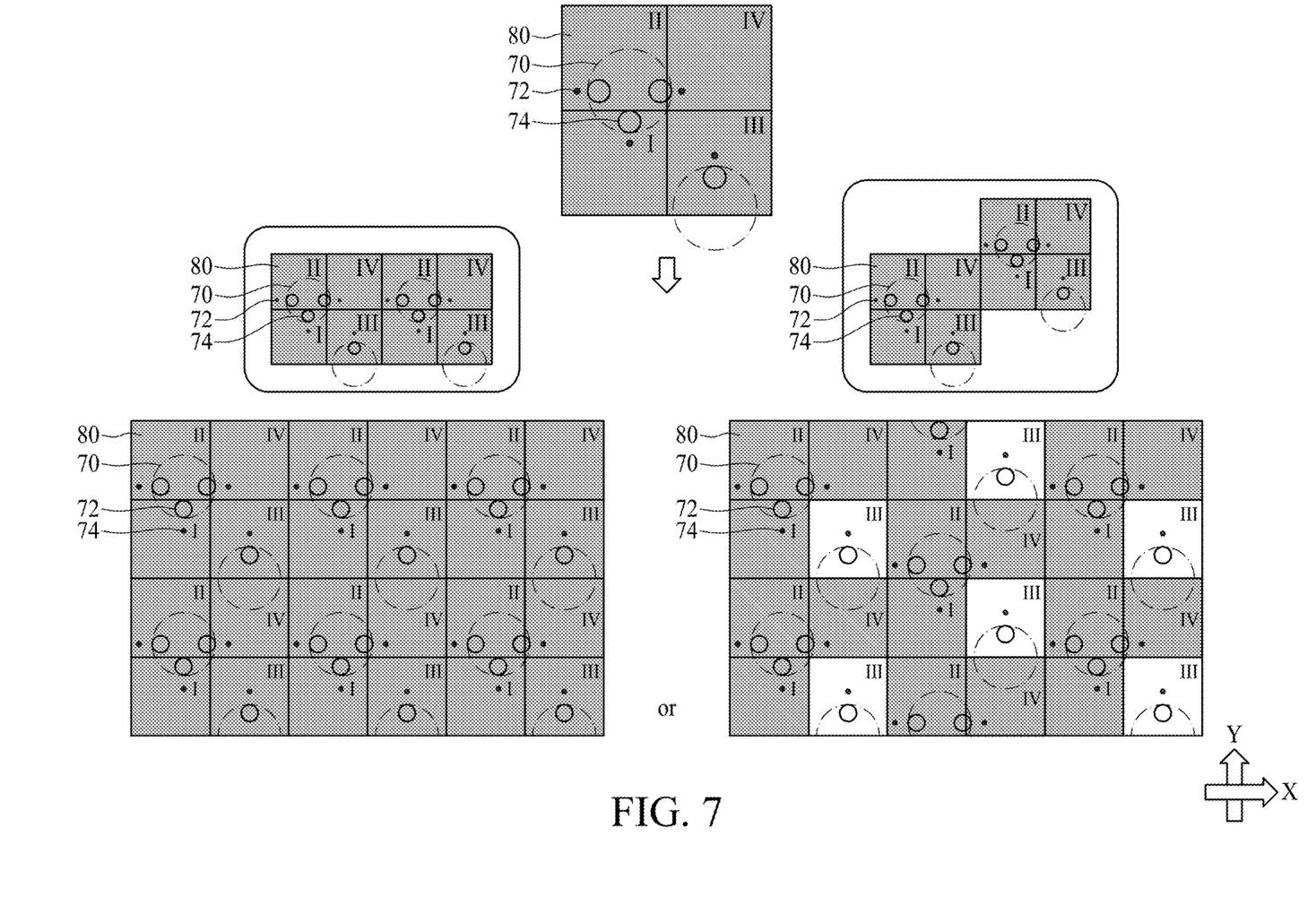
FIG. 7 illustrates a top view of the optical module in accordance with some embodiments of the present disclosure.

FIG. 7 illustrates a top view of the optical module 1 in accordance with some embodiments of the present disclosure. In some embodiments, the four regions I to IV of the pixels have two combination designs. A set of the four regions I to IV is aligned with another set of the four regions I to IV. In some embodiments, a set of the four regions I to IV is shifted from another set of the four regions I to IV.

Figure 8A:
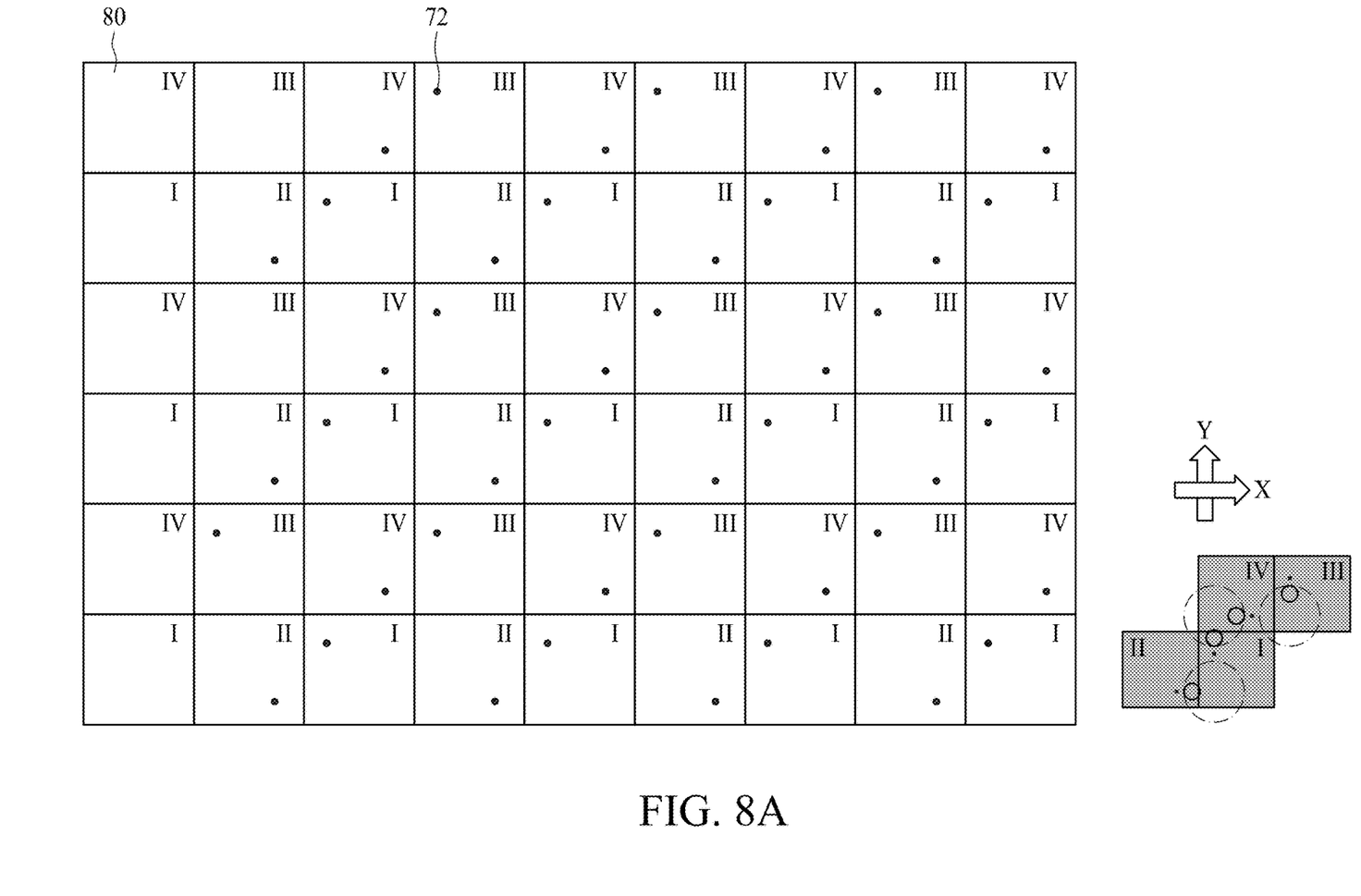
FIG. 8A to FIG. 8F illustrates a top view of an exploded view of the optical module in accordance with some embodiments of the present disclosure.

FIG. 8A illustrates a top view of an exploded view of the optical module 1 in accordance with some embodiments of the present disclosure. In some embodiments, the holes 72 are disposed as a line (slash). One hole 72 is disposed in one pixel 80.

Figure 8B:
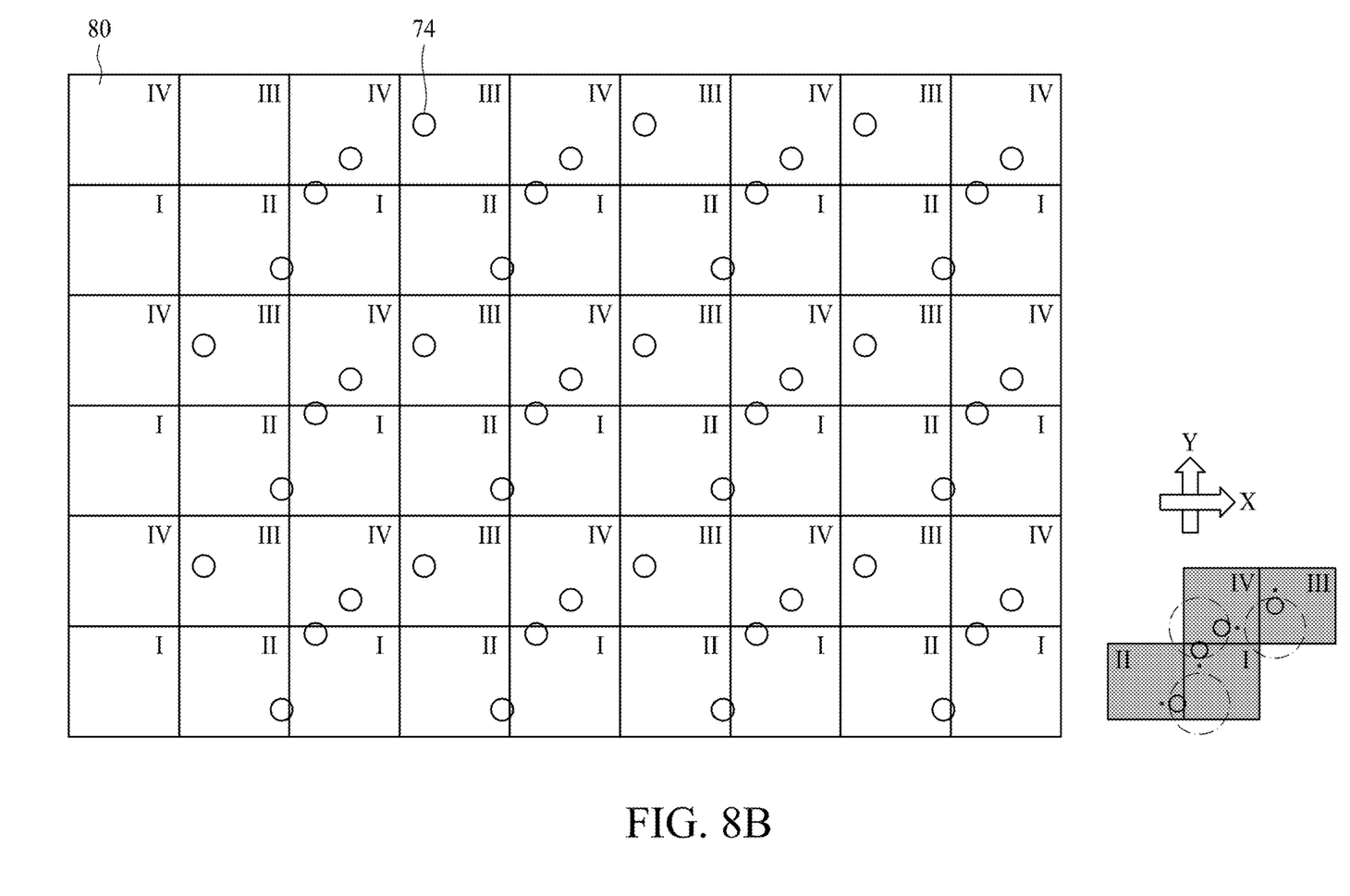

FIG. 8B illustrates a top view of an exploded view of the optical module 1 in accordance with some embodiments of the present disclosure. In some embodiments, one aperture 74 is disposed in one pixel 80. In some embodiments, a projection of some of the apertures 74 fall on one pixel 80. In some embodiments, a projection of some of the apertures 74 fall on two pixels 80.

Figure 8C:
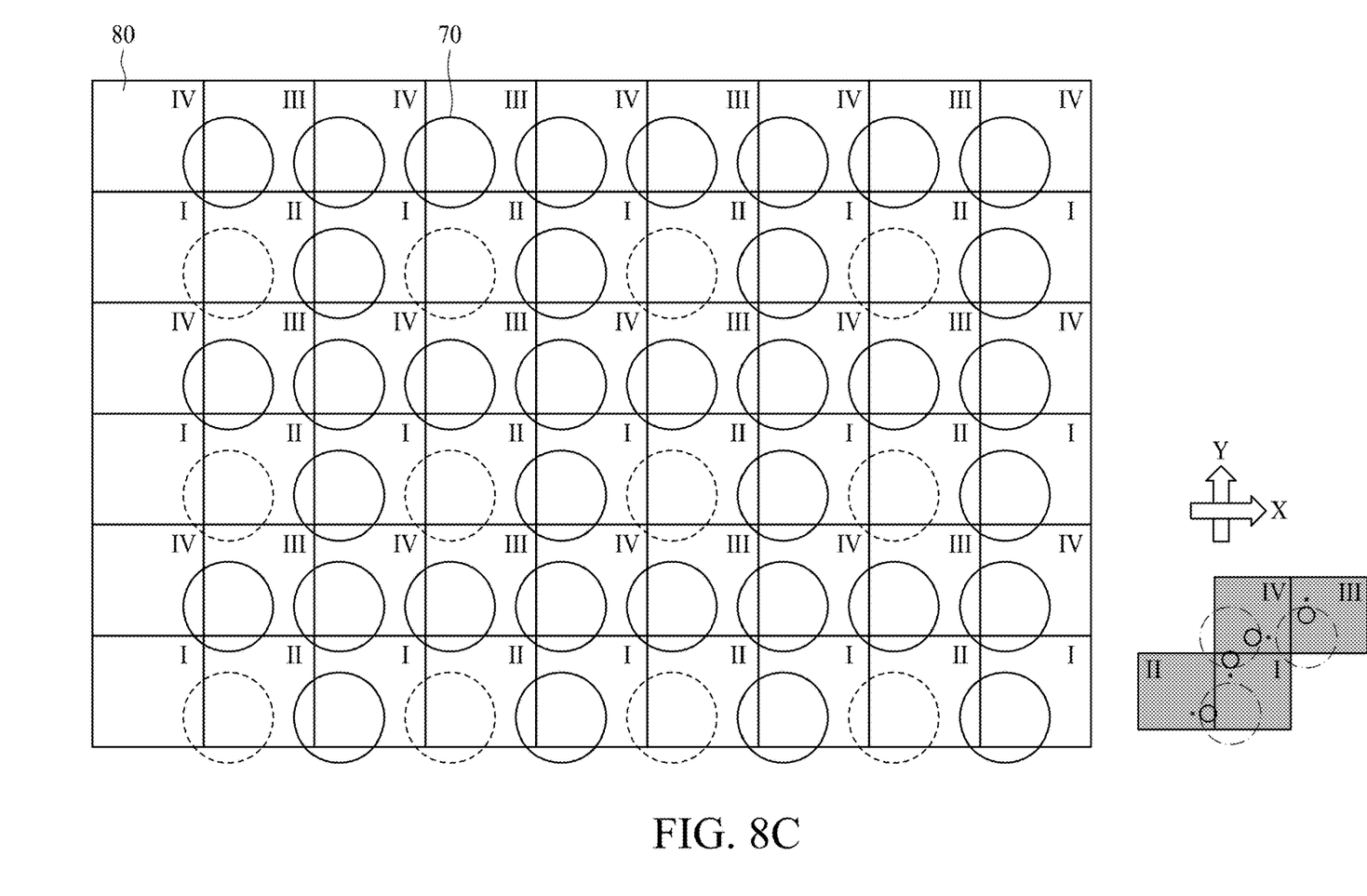

FIG. 8C illustrates a top view of an exploded view of the optical module 1 in accordance with some embodiments of the present disclosure. In some embodiments, a projection of one lens of the micro lens array 70 falls on four pixels. In some embodiments, the pixel is partially covered by a projection of four lenses.

Figure 8D:
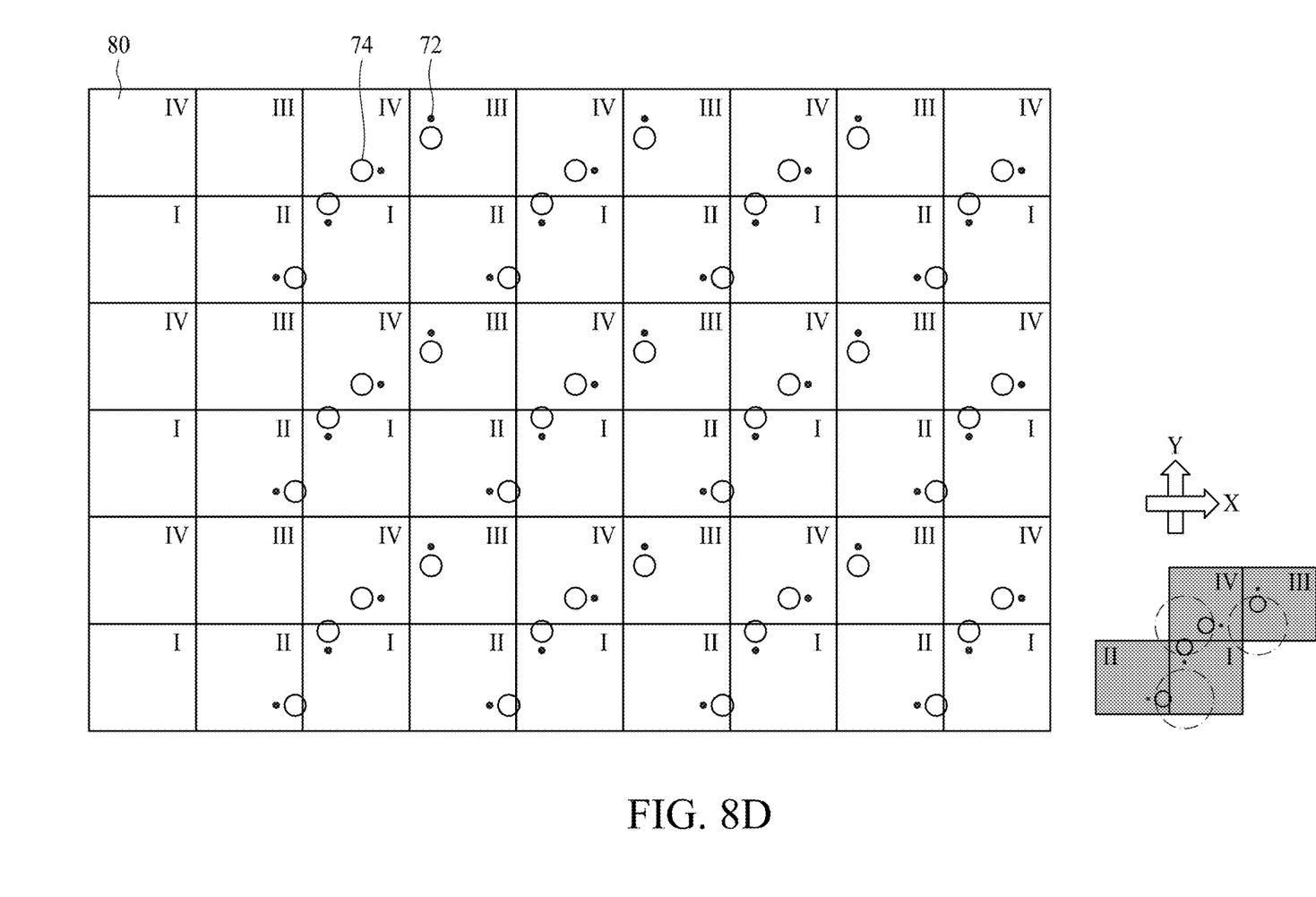

FIG. 8D illustrates a top view of an exploded view of the optical module 1 in accordance with some embodiments of the present disclosure. In some embodiments, a projection of one of the apertures 74 is apart from one hole 72.

Figure 8E:
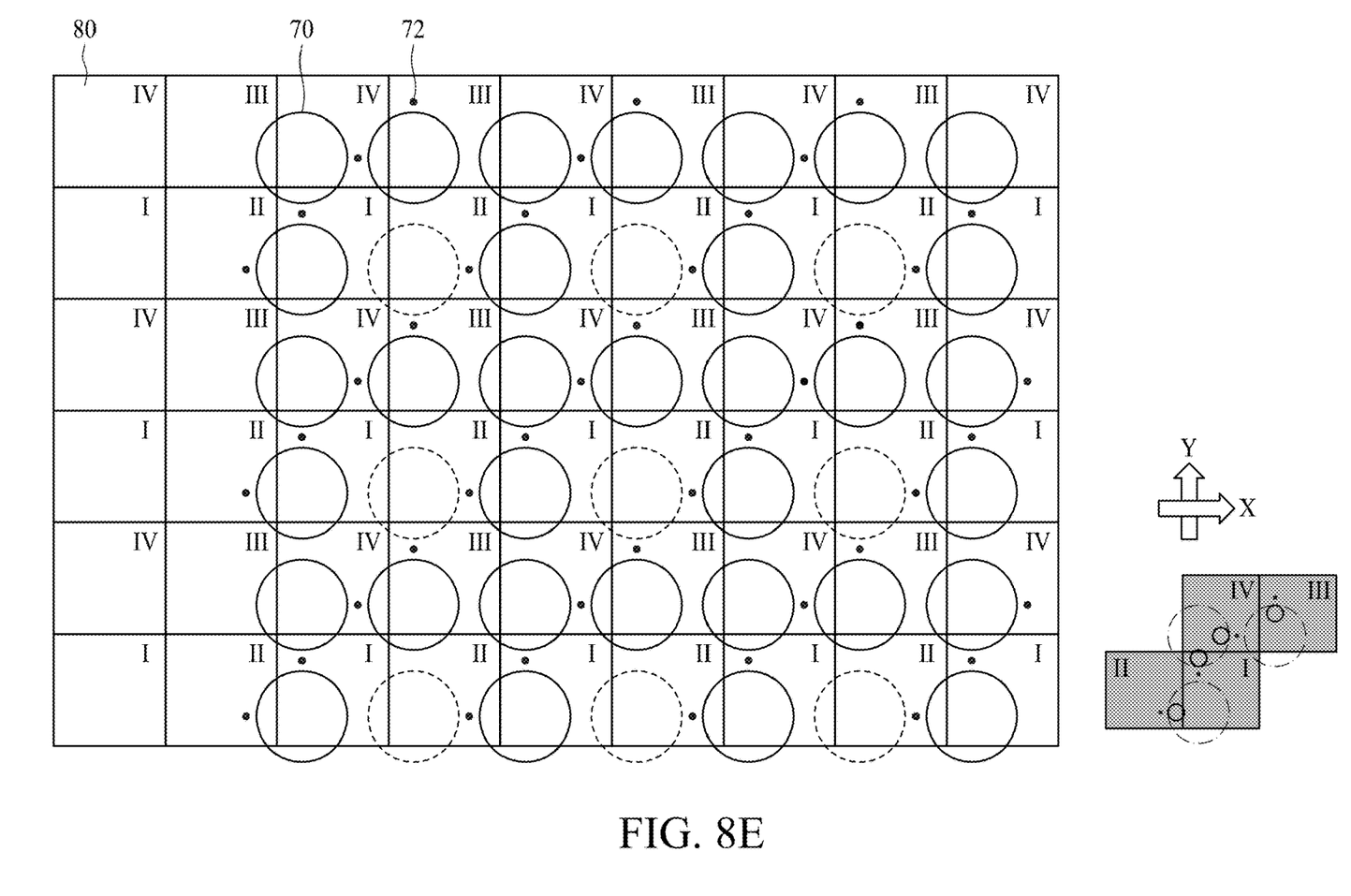

FIG. 8E illustrates a top view of an exploded view of the optical module 1 in accordance with some embodiments of the present disclosure. In some embodiments, a projection of one lens of the micro lens array 70 is apart from one hole 72.

Figure 8F:
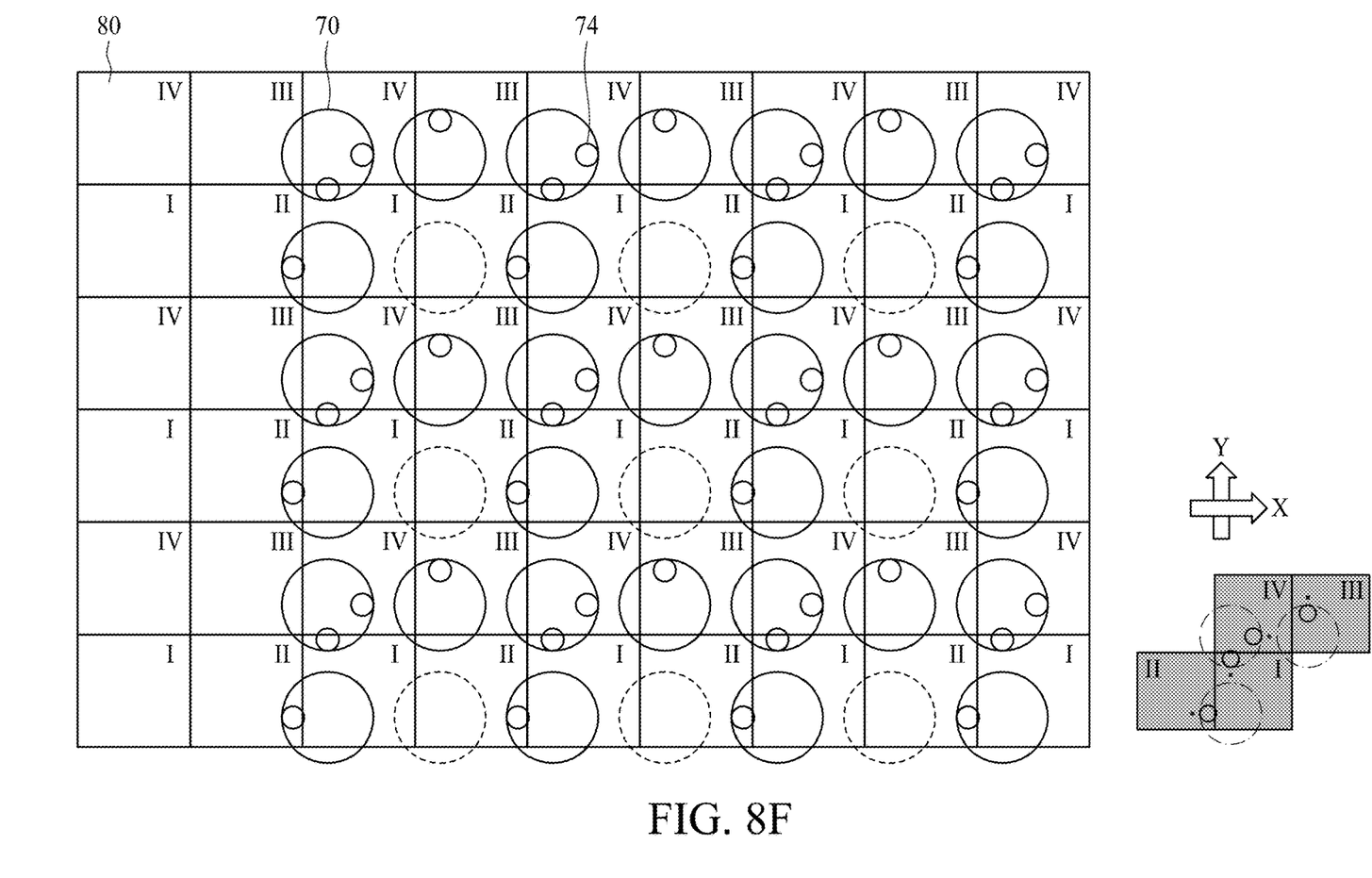

FIG. 8F illustrates a top view of an exploded view of the optical module 1 in accordance with some embodiments of the present disclosure. In some embodiments, a projection of one lens of the micro lens array 70 falls on one or two apertures 74. In some embodiments, a projection of one lens of the micro lens array 70 do not falls on an aperture 74, such as the lens depicted as the dot line in the pixel region II.

Figure 9:
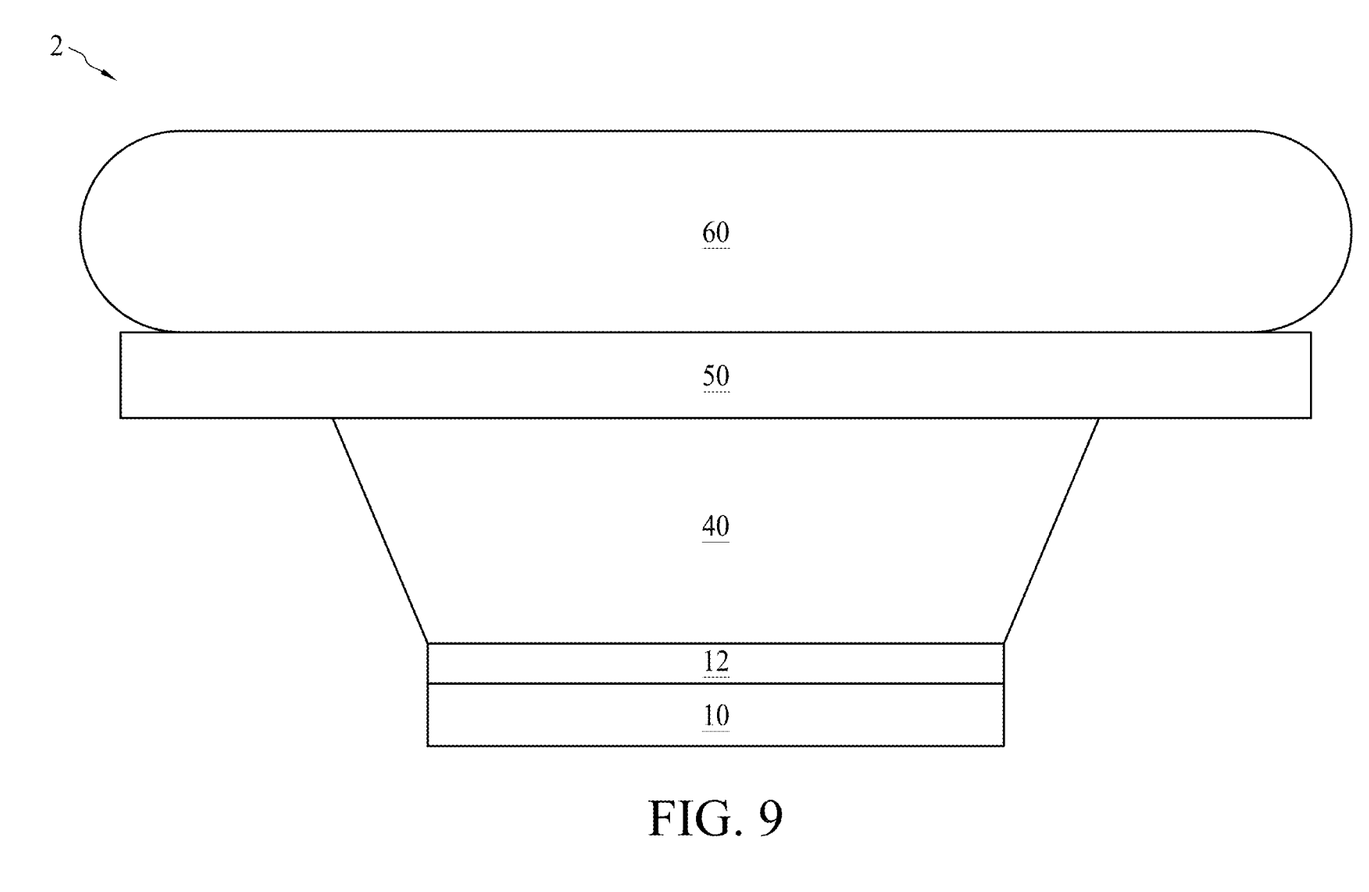
FIG. 9 illustrates a cross section of an optical module in accordance with some embodiments of the present disclosure.

FIG. 9 illustrates a cross section of an optical module 2 in accordance with some embodiments of the present disclosure. The optical module 2 includes an image sensor 10, an opaque layer 12, a light path 40 and an illuminated target as finger 60.

The image sensor 10 includes at least one group of pixels 80. In some embodiments, the image sensor 10 includes a plurality of CISs. The image sensor 10 includes at least one group of pixels 80. In some embodiments, the micro lens array 70 is disposed on the image sensor 10. The opaque layer 72a includes a plurality of apertures 74. The light path 40 may be a cone path for receiving the incident light. In some embodiments, the illuminated light source 50 may be an organic light-emitting diode (OLED). The finger 60 may be pressed on the illuminated light source 50 and the light reflected by the finger 60 may be received by the image sensor 10.

Figure 10:
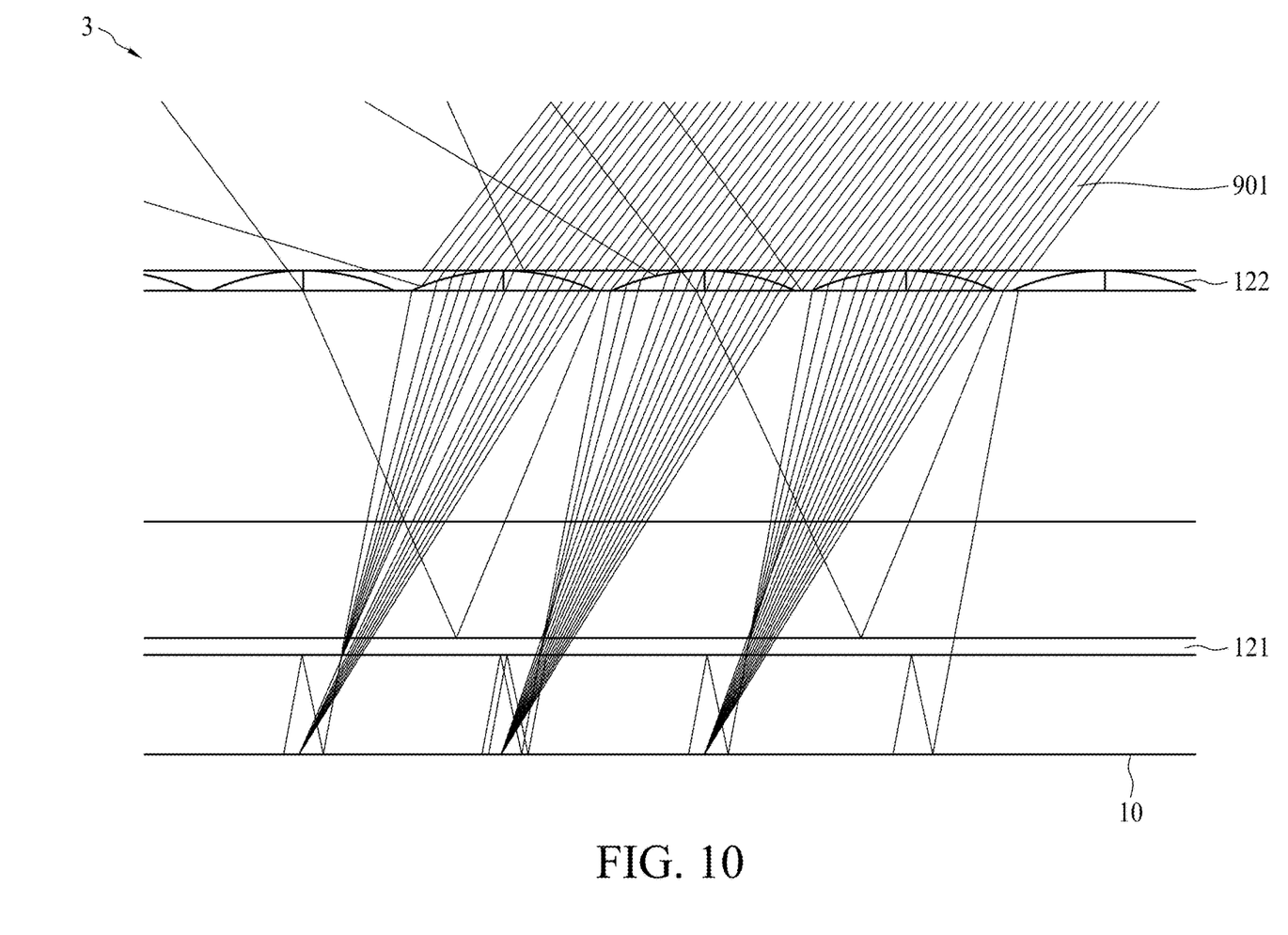
FIG. 10 illustrates a cross section of an optical module in accordance with some embodiments of the present disclosure.

FIG. 10 illustrates a cross section of an optical module 3 in accordance with some embodiments of the present disclosure. The optical module 3 includes an image sensor 10, an opaque layer 121 and a micro lens array 122. The incident light 901 is illuminated on the micro lens array 122. The incident light 901 passes through the the micro lens array 121 and is refracted. The incident light 901 passes through the opaque layer 121 and is illuminated on the image sensor 10.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" or "about" the same if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations do not limit the present disclosure. It can be clearly understood by those skilled in the art that various changes may be made, and equivalent elements may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and such. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. An optical module, comprising:
   an image sensor having at least one group of pixels;
   a micro lens array disposed on the image sensor, wherein a plurality of micro lens of the micro lens array are substantially arranged along a direction; and
   a first opaque layer having at least three first apertures with a first substantially equal diameter;
   a second opaque layer having at least three second apertures with a second substantially equal diameter different from the first substantially equal diameter;
   wherein the at least three first apertures are substantially and continuously arranged in a first pitch and the at least three second apertures are substantially and continuously arranged in a second pitch, wherein the first pitch is equal to the second pitch, wherein the at least three first apertures are offset from the at least three second apertures.

2. An optical module, comprising:
an image sensor having at least one group of pixels;
a micro lens array disposed on the image sensor; and
an opaque layer covering and contacting the at least one group of pixels, wherein the opaque layer comprises a plurality of apertures defining a first plurality of detecting regions on the at least one group of pixels, wherein an area of one of the first plurality of detecting regions is substantially equal to an area of one corresponding aperture of the plurality of apertures,
wherein each of the first plurality of detecting regions is located on one corresponding pixel of the at least one group of pixels and has a geometrical center misaligned with a geometrical center of the corresponding pixel of the at least one group of pixels from a top view perspective.

3. The optical module of claim 2, wherein the geometrical center of the corresponding pixel of the at least one group of pixels is covered by the opaque layer.

4. The optical module of claim 3, wherein any two apertures of the plurality of apertures are independently arranged and disconnected to each other.

5. An optical module, comprising:
an image sensor having at least one group of pixels;
a micro lens array disposed on the image sensor; and
an opaque layer covering and contacting the at least one group of pixels, wherein the opaque layer comprises a plurality of apertures defining a first plurality of detecting regions on the at least one group of pixels, wherein an area of one of the first plurality of detecting regions is substantially equal to an area of one corresponding aperture of the plurality of apertures,
wherein each of the plurality of apertures is located between two corresponding adjacent micro lenses of the micro lens array from a top view perspective.

6. The optical module of claim 5, wherein a vertical projection area of each of the plurality of apertures is outside a vertical projection area of each of the two corresponding adjacent micro lenses of the micro lens array.

7. An optical module, comprising:
an image sensor having at least one group of pixels;
a micro lens array disposed on the image sensor;
an opaque layer covering and contacting the at least one group of pixels, wherein the opaque layer comprises a plurality of apertures defining a first plurality of detecting regions on the at least one group of pixels, wherein an area of one of the first plurality of detecting regions is substantially equal to an area of one corresponding aperture of the plurality of apertures; and
a second opaque layer located between the micro lens array and the opaque layer, wherein the second opaque layer is not connected to the opaque layer and comprises a plurality of second apertures.

8. The optical module of claim 7, wherein a vertical projection area of each of the plurality of second apertures is outside a vertical projection area of one aperture of the plurality of apertures from a top view perspective.

9. The optical module of claim 7, wherein a distance between any two adjacent apertures of the plurality of second apertures is substantially consistent, and a distance between any two adjacent apertures of the plurality of apertures is substantially consistent.

* * * * *